United States Patent [19]

Nakase et al.

[11] Patent Number: 4,870,367
[45] Date of Patent: Sep. 26, 1989

[54] SIGNAL AMPLIFIER CIRCUIT

[75] Inventors: Kouji Nakase; Kazuo Hasegawa, both of Furukawa, Japan

[73] Assignee: Alps Electric Co., Ltd., Tokyo, Japan

[21] Appl. No.: 227,482

[22] Filed: Aug. 1, 1988

Related U.S. Application Data

[63] Continuation of Ser. No. 16,837, Feb. 19, 1987, abandoned.

[30] Foreign Application Priority Data

Jun. 12, 1986 [JP] Japan ................... 61-137202

[51] Int. Cl.$^4$ .......................... H03K 5/02; H03K 5/08; H03K 5/24
[52] U.S. Cl. .................... 328/168; 307/358; 307/362
[58] Field of Search ............... 307/311, 358, 362; 328/168, 169, 171

[56] References Cited

U.S. PATENT DOCUMENTS

| 3,701,886 | 10/1972 | Jones . | |
|---|---|---|---|
| 3,708,678 | 1/1973 | Kreda | 307/358 |
| 3,781,692 | 12/1973 | Escoffier | 307/362 |
| 4,578,568 | 3/1986 | Tsuzuki | 307/358 |

FOREIGN PATENT DOCUMENTS 0137944  10/1979  Japan ................... 307/358

*Primary Examiner*—John Zazworsky
*Attorney, Agent, or Firm*—Guy W. Shoup; Paul J. Winters; Brian D. Ogonowsky

[57] ABSTRACT

A signal amplifier circuit which can amplify, with a simple construction, an AC component having an amplitude of one polarity with accuracy from a composite signal which contains a DC component combined with the AC component. The circuit comprises a comparing amplifier circuit connected to receive such a composite signal at an input terminal thereof via a capacitor, means connected to the other input terminal of the comparing amplifier circuit for providing a reference voltage to the latter, and a clamping circuit for clamping the signal which has passed the capacitor to the reference voltage.

8 Claims, 4 Drawing Sheets

SIGNAL AMPLIFIER CIRCUIT

RELATED APPLICATIONS

This is a continuation of patent application Ser. No. 07/016,837, entitled "Signal Amplifier Circuit", by K. Nakase et al., filed Feb. 19, 1987, now abandoned.

BACKGROUND OF THE INVENTION

This invention relates to a signal amplifying circuit for amplifying an AC signal obtained from a unipolar signal having a DC signal overlapped with an AC component, and more particularly to an improved signal amplifying circuit for for amplifying said AC signal and generating a highly accurate output waveform.

In general, a bar-code reading device is constructed such that the desired character information is provided by codes having, in combination, a plurality of bars (having a high rate of optical absorption) of various widths and spacings (having a high rate of optical reflection) of various widths, wherein a light is irradiated against a scanned bar-code surface optically recorded with the character information, and a variation of reflected light from the bar-code surface is detected and converted into an electrical signal through an optical sensor (a photoelectrical conversion element) so as to read the bar-code.

An electrical signal generated by an optical sensor through a scanning operation over the bar-code surface comprises a unipolar AC component of small amplitude, wherein said AC component is intermittently varied in response to the reflected light from the bar codes, and a high DC component caused by external light, "dark" current through the optical sensor, and the like. Therefore, in order to read the bar-codes and interpret the codes, it is necessary to amplify the above-mentioned AC component up to a desired level and to make the amplified AC signal capable of being processed by a binary circuit for detecting the various bar widths in the code.

A signal processing circuit for processing a signal generated from an optical sensor in the conventional type of bar-code reading device described above will be described with reference to FIGS. 4 to 6.

FIG. 4 is a schematic diagram of a signal processing circuit having a signal amplifier of a conventional DC junction type (hereinafter called "DC type"), wherein a light irradiated against a bar code surface (not shown) by light emitting diode (LED) 1, emitting light in response to an electric current supplied from positive power supply terminal +B through an electric current limiting resistor, is reflected in response to a reflection factor of the bar code surface. This reflected light is scanned in sequence and made incident to phototransistor 2 acting as a light receiving element. This NPN type phototransistor 2 has a collector connected to the power supply terminal +B through a resistor. An emitter voltage of phototransistor 2 at point "a" is varied in response to the amount of reflected light, where an increased collector current results from an increase in the amount of reflected light. In case of sensing a black bar, the voltage at point "a" would thus decrease The emitter voltage (assuming no other element is connected to point "a") consists of a DC component, resulting from external light and a "dark" current through phototransistor 2, overlapped with an AC component corresponding to the variation in the amount of light reflected from the scanned bar-code surface. This DC component is substantially varied in response to a variation in the strength of any external light. A predetermined fixed bias voltage is added to the emitter voltage of phototransistor 2 by means of a bias circuit 3 so that the operating voltage to be applied to an inverting amplifier circuit 4 may be maintained substantially constant. Thus, the inverting amplifier circuit 4 amplifies a signal relative to a reference voltage provided by the bias voltage and hence amplifies only the AC component of the signal.

In the signal amplifier circuit of the DC coupling type shown in FIG. 4, a signal relative to an operating voltage set by the bias circuit 3, as shown by waveform (a) of FIG. 5, is applied to inverting amplifier circuit 4. Accordingly, if inverting amplifier circuit 4 accomplishes an amplifying operation relative to the operating voltage, only an AC component will be inverted and amplified by the inverting amplifier circuit 4. However, if the DC component changes due to a change of disturbant light or the like, the operating voltage changes accordingly. As a result, not only the AC component of the voltage at point "a" will be amplified but also the DC component due to a difference between the operating voltage and the bias voltage will be amplified. If the DC component is large, it is a potential problem that the amplified signal is distorted at the maximum amplitude of the output of inverting amplifier circuit 4, as shown by waveform (b) of FIG. 5, and hence the AC component cannot be amplified with accuracy. It is to be noted that FIG. 5 and FIGS. 2 and 7, which will be hereinafter described show waveforms of signals where barcodes are represented by black marks on a ground of white.

A signal amplifier circuit of the AC coupling type, shown in FIG. 6, will now be described. The signal amplifier circuit of FIG. 6 includes a phototransistor 2, the emitter voltage of which is applied to an inverting amplifier circuit 4 via a capacitor 5. Thus, a DC component of the signal is removed by capacitor 5 and hence only an AC component is amplified by inverting amplifier circuit 4. The signal amplifier circuit of FIG. 6 further includes a binary digitizing circuit 6 for converting the output of the inverting amplifier circuit 4 into a binary signal, and an automatic threshold level setting circuit 7 for setting a threshold level of the binary digitizing circuit 6 in response to an output of the inverting amplifier circuit 4.

Further, in the signal amplifier circuit of the AC coupling type shown in FIG. 6, a signal developed from phototransistor 2 presents a waveform as shown by (a) of FIG. 7 wherein the amplitude appears on only the lower side of the operating voltage. Accordingly, as the DC component is removed by the capacitor 5, the signal which has passed the capacitor 5 presents a waveform as shown by (c) of FIG. 7 wherein the operating voltage gradually rises in accordance with an attenuation characteristic. Thus, if the signal which has passed the capacitor 5 is amplified by the inverting amplifier circuit 4, the latter will provide an output having an attenuation characteristic as seen from a waveform (d) of FIG. 7. Then, if the output of the inverting amplifier circuit 4 is binary digitized by the binary digitizing circuit 6 with a predetermined fixed threshold level, the output of the binary digitizing circuit 6 will present variation in width in accordance with the attenuation characteristic, resulting in failure to attain accurate binary digitization corresponding to the width of the AC component appearing in the emitter voltage of phototransistor 2. Accordingly, the automatic threshold level setting circuit 7 is necessitated to set a threshold level which follows in accordance with the attenuation characteristic. However, it is a problem that the automatic threshold level setting circuit 7 is complicated in construction.

SUMMARY OF THE INVENTION

It is an object of the present invention to provide a signal processing amplifier of simple construction for obtaining an amplified signal from a signal having an AC component overlapping a DC component, from which an accurate binary reading can be attained.

In order to attain the object, according to the invention, there is provided a signal amplifier circuit which comprises a capacitor for filtering out a DC component from a signal containing a unipolar AC component intermittently overlapped with the DC component. A reference voltage is generated which sets the voltage at which the filtered signal is clamped, and this clamped AC signal is applied to an inverting input port of a comparing amplifier via a resistor. The reference voltage is also applied to a noninverting input port of the comparing amplifier so that the output of the comparing amplifier is an AC waveform which is not affected by changes in operating voltage and, hence, may be processed by a binary digitizing circuit to obtain an accurate code.

The above and other objects, features and advantages of the present invention will become apparent from the following description and the appended claims, taken in conjunction with the accompanying drawings.

DESCRIPTION OF THE PREFERRED EMBODIMENT

Figure 1:
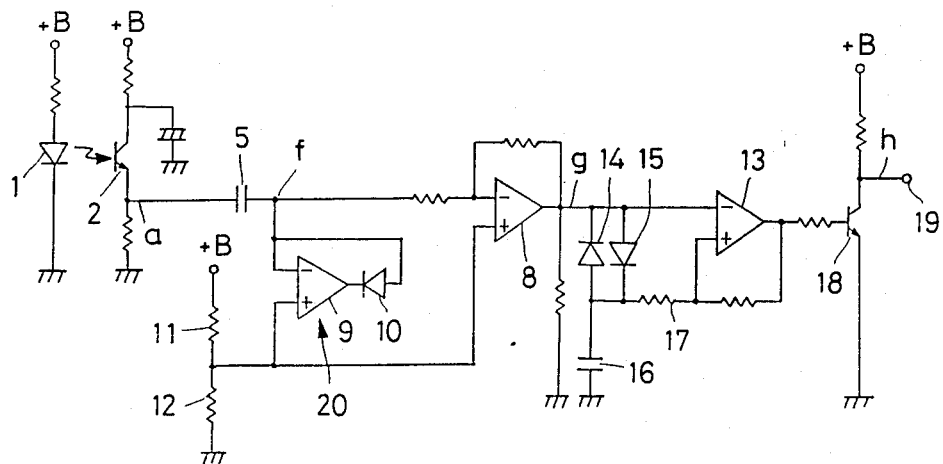
FIG. 1 is a circuit diagram of a bar-code reading circuit to which a signal amplifier circuit according to the present invention is applied.

Referring to FIG. 1, there is illustrated a bar-code reading circuit which incorporates a signal amplifier circuit according to the present invention. The bar-code reading circuit includes a light emitting diode 1 which emits light to irradiate upon a bar-code carrying face, and a phototransistor 2 which receives light reflected from the bar-code carrying face as the bar-code carrying face is scanned and provides as an output thereof an emitter voltage which varies as a function of the intensity of the light reflected from the bar-code carrying face. The emitter of the phototransistor 2 is connected to one end of capacitor 5. The other end of capacitor 5 is coupled to the inverting input terminal of a comparing amplifier circuit 8 through a resistor and also coupled to the inverting input terminal of another comparing amplifier circuit 9, and the anode of diode 10. The cathode of the diode 10 is connected to the output terminal of the comparing amplifier circuit 9. A voltage of a power supply is divided by resistors 11, 12 to establish a reference voltage. The voltage dividing point at a junction between the resistors 11, 12 is connected to the noninverting input terminals of comparing amplifier circuits 8 and 9. Here, comparing amplifier circuit 8 operates as an inverting amplifier circuit while comparing amplifier circuit 9 and diode 10 cooperate to form an ideal diode and operate as a clamping circuit 20 together with the capacitor 5. Thus, clamping circuit 20 acts to clamp the peak AC voltage at point "f" to approximately the reference voltage plus one diode drop, as shown in FIG. 2(f). Hence, the output of comparing amplifier 8 at point "g" is that shown in FIG. 2(g). The output terminal of comparing amplifier circuit 8 is connected to the inverting input terminal of a further comparing amplifier circuit 13 and also to an anti-parallel combination of diodes 14, 15. The other ends of diodes 14, 15 of the anti-parallel combination are grounded via capacitor 16 and is connected also to the noninverting input terminal of comparing amplifier circuit 13 via resistor 17. Here, diodes 14, 15 and capacitor 16 operate as an automatic threshold level setting circuit while comparing amplifier circuit 13 operates as a binary digitizing circuit. Further, the output terminal of the comparing amplifier circuit 13 is connected to the base of a transistor 18, and a binary digitized signal output terminal 19 is connected to the collector of the transistor 18.

Figure 2:
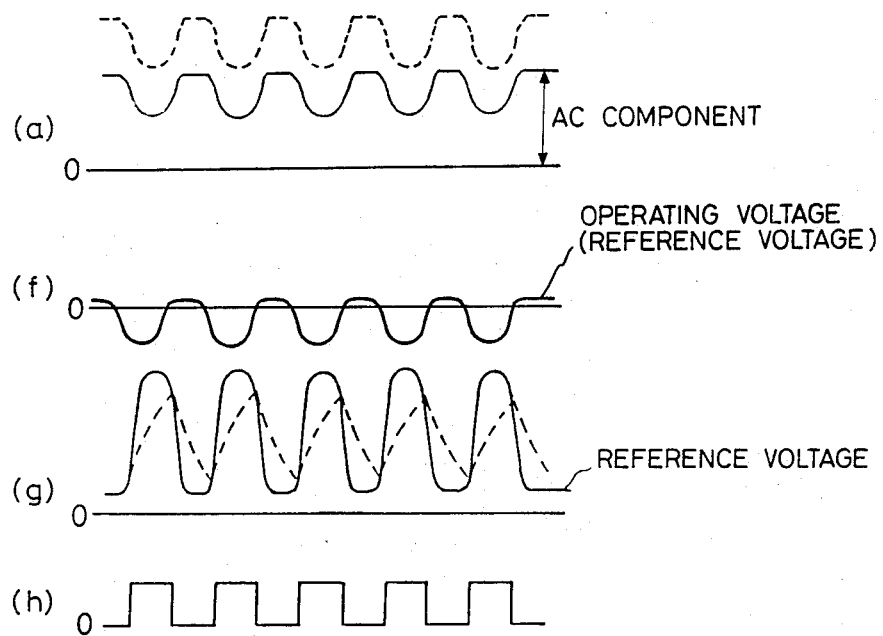
FIG. 2 is a waveform chart illustrating operations of the circuit of FIG. 1.
Figure 4:
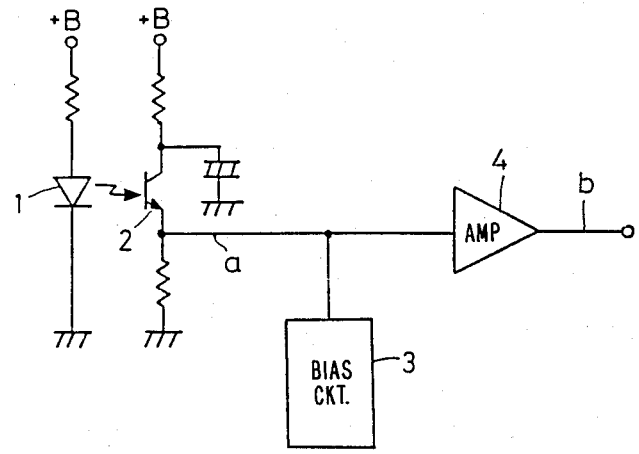
FIG. 4 is a circuit diagram of a conventional signal amplifier circuit of the DC coupling type.
Figure 5:
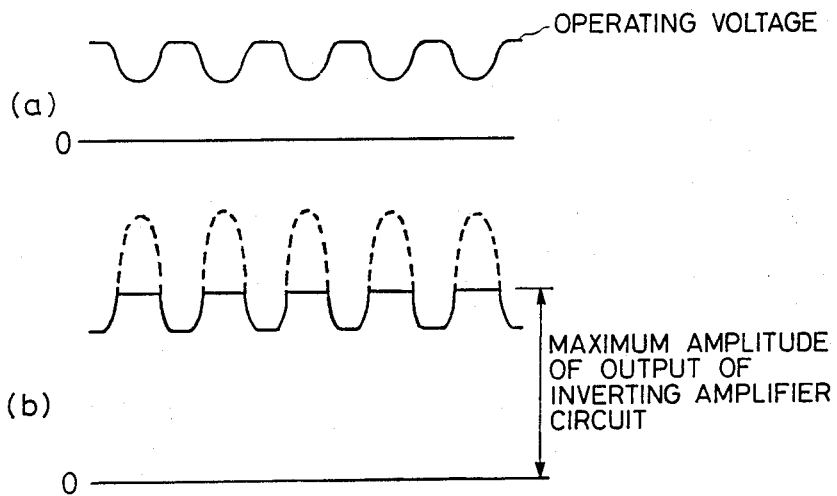
FIG. 5 is a waveform chart illustrating operations of the circuit of FIG. 4.
Figure 6:
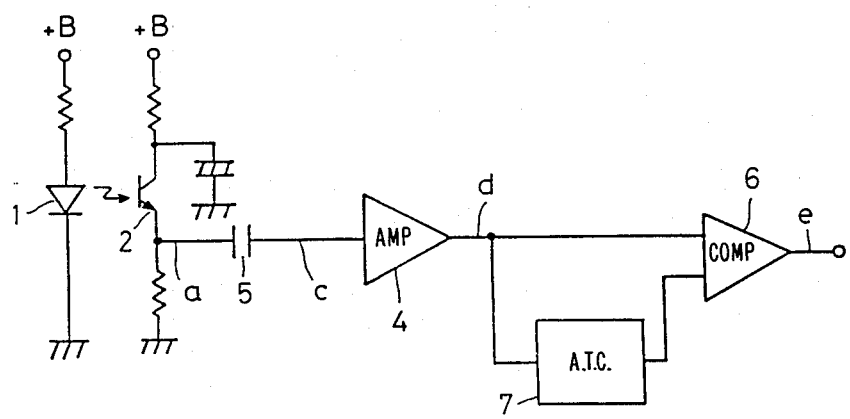
FIG. 6 is a circuit diagram of another conventional signal amplifier circuit of the dc coupling type.
Figure 7:
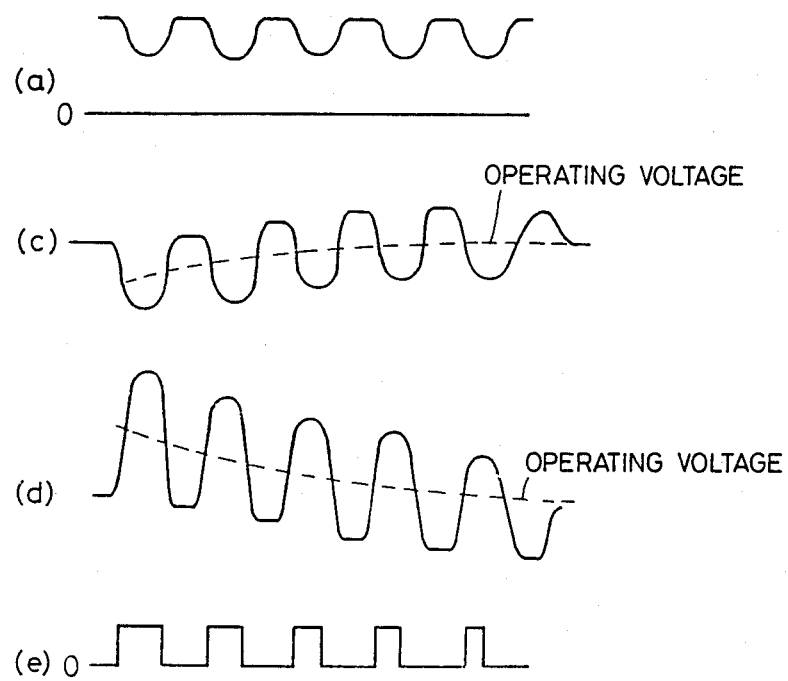
FIG. 7 is a waveform chart illustrating operations of the circuit of FIG. 6.

Now, operation of the bar-code reading circuit having such a construction as described above will be described further with reference to FIG. 2. The emitter voltage of the phototransistor 2 contains a DC component, which varies due to a change in intensity of disturbant light as seen from solid and broken line representations of waveforms (a) of FIG. 2, and an AC component, which is combined with the DC component and varies due to a difference in intensity of light reflected from bar-codes. The signal is passed through capacitor 5 to remove the DC component thereof, and the peak value of the filtered signal is clamped, as shown in FIG. 2(f), to approximately the reference voltage by clamping circuit 20, composed of comparing amplifier circuit 9 and diode 10, and is applied to the inverting input terminal of comparing amplifier circuit 8. Here, the AC component arising from a difference of reflected light from bar-codes is very low and about several tens mV. Therefore, the reference voltage to be applied to the noninverting input terminal of comparing amplifier circuit 8 is set to 0.6V or so in order that the AC component may be applied to a maximum output amplitude by comparing amplifier circuit 8 as shown by a solid line representation of waveform (g) of FIG. 2. A part of the amplified signal outputted from comparing amplifier 8 is supplied to an automatic threshold value setting circuit comprising diodes 14 and 15 and capacitor 16, which generates a waveform as shown in FIG. 2(g) by a broken line. This waveform is supplied to the noninverting input terminal of comparing amplifier circuit 13 which binary digitizes the output signal of comparing amplifier circuit 8 with reference to the threshold level, as determined by the broken line waveform in FIG. 2(g). The output signal of comparing amplifier circuit 13 is inverted by transistor 18 so that a binary digitized signal as shown by a waveform (h) of FIG. 2 is developed at the binary digitized signal output terminal 19. In this manner, the amplified signal outputted from comparing amplifier 8 is made such that the AC component, caused by a variation of an amount of reflected light of the bar-code, appearing in the emitter voltage of phototransistor 2 is processed accurately, and hence a binary digitized signal which corresponds accurately to the width of the AC component is produced with a simple circuit construction.

Figure 3:
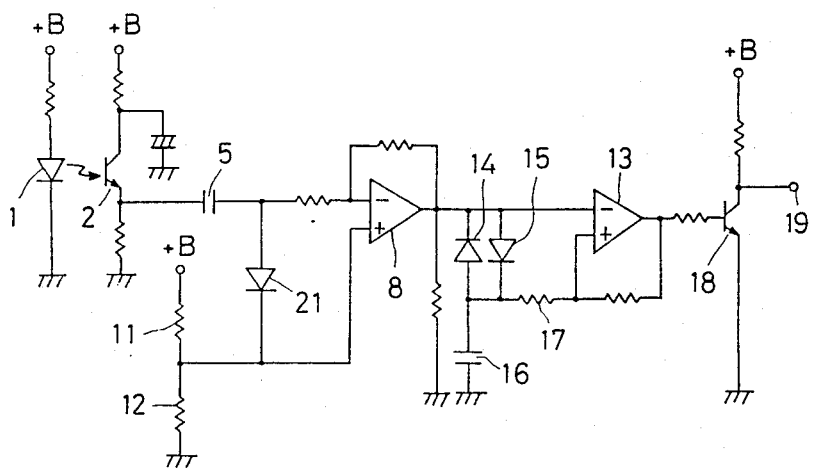
FIG. 3 is a circuit diagram of another bar-code reading circuit to which a signal amplifier circuit according to another embodiment of the invention is applied.

Referring now to FIG. 3, there is shown a different bar-code reading circuit which employs a signal amplifying circuit according to another embodiment of the invention. In FIG. 3, like circuit components are denoted by like reference numerals to those of FIG. 1, and detailed description thereof is omitted herein to avoid redundancy.

The circuit shown in FIG. 3 is different from that of FIG. 1 in that, in place of the clamping circuit 20 composed of comparing amplifier circuit 9 and diode 10 of FIG. 1, diode 21 is employed to clamp the operating voltage of a signal, which has passed through capacitor 5, to the reference voltage. According to the embodiment shown in FIG. 3, the circuit construction can be made very simple.

It is to be noted that in the embodiments described hereinabove an AC component arising from scanned bar-codes has an amplitude of a polarity to lower a voltage of a signal because the signal is derived from the emitter of the phototransistor 2 which receives light reflected from bar-codes of a bar-code carrying face of a record medium which has bar marks of black recorded on a ground of white. Therefore, a clamping circuit is provided so that the operating voltage of the signal which has passed the capacitor 5 may have a maximum voltage equal to the reference voltage. However, if the AC component has an amplitude of the opposite polarity to raise the signal 27 voltage (e.g., if the signal was obtained from the collector of phototransistor 2), a clamping circuit must be provided so that the operating voltage of the signal which has passed the capacitor 5 may have a minimum voltage equal to the reference voltage. Meanwhile, the clamping circuit is not limited to those of the embodiments described hereinabove and may have any circuit construction if it can clamp the operating voltage of the signal which has passed the capacitor 5 to the reference voltage. Further, it is a matter of course that the application of the signal amplifier circuit of the present invention is not limited to a bar-code reading circuit and it can be used widely as a circuit which amplifies only an AC component, having an amplitude of one polarity, of a signal which contains a DC component.

As apparent from the foregoing description, according to the present invention, only an AC component having an amplitude of one polarity can be amplified with accuracy from a signal which contains a DC component combined with the AC component.

A further feature of the invention is that since an operating voltage of a signal and the reference voltage applied to the amplifier circuit are not displaced from each other, the amplified signal does not undergo a distortion at the maximum amplitude of the output of the amplifier circuit and hence the output amplitude of the amplifier can be utilized effectively. Accordingly, where a signal amplifier circuit of the present invention is employed in a bar-code reading circuit, an excellent effect can be obtained that a binary signal which corresponds to the width of an AC component has a good signal to noise ratio and can be obtained with a simple construction of a binary digitizing circuit and an automatic threshold level setting circuit in a later stage.

Having now fully described the invention, it will be apparent to one of ordinary skill in the art that many changes and modifications can be made thereto without departing from the spirit and scope of the invention as set forth herein.

What is claimed is:

1. A signal processing circuit for processing a unipolar AC component which is small in amplitude in relation to, and is superimposed on, a DC component of an input signal, comprising:

a capacitor having one end connected to receive said input signal for removing said DC component and outputting at its other end a signal of only said AC component;

a reference voltage providing means for supplying a reference voltage signal;

a clamping circuit for clamping a peak voltage of said AC component to said reference voltage signal; and a comparing amplifier having a first terminal connected via a current limiting resistor to said other end of said capacitor for receiving and amplifying said AC component signal clamped to said reference voltage signal, and having a second terminal for receiving said reference voltage signal, said comparing amplifier having connected between its output terminal and its inverting input terminal a feedback resistor, which, in conjunction with said current limiting resistor, caused said comparing amplifier to amplify said clamped AC component signal without distortion for further processing.

2. The signal processing circuit of claim 1 wherein said first terminal of said comparing amplifier is said inverting terminal, and said second terminal of said comparing amplifier is a noninverting terminal.

3. The signal processing circuit of claim 1 wherein said clamping circuit comprises a diode having an anode connected to said other end of said capacitor and a cathode connected to receive said reference voltage signal.

4. The signal processing circuit of claim 1 wherein said clamping circuit comprises a second comparing amplifier having a noninverting terminal coupled to receive said reference voltage signal and an inverting terminal coupled to said other end of said capacitor, with an output terminal coupled to a cathode of a second diode, wherein an anode of said second diode is also coupled to said other end of said capacitor.

5. The signal processing circuit of claim 1 wherein said further processing includes converting said amplified clamped AC component signal to a binary waveform.

6. The signal processing circuit of claim 2 wherein said further processing includes converting said amplified clamped AC component signal to a binary waveform.

7. The signal processing circuit of claim 3 wherein said further processing includes converting said amplified clamped AC component signal to a binary waveform.

8. The signal processing circuit of claim 4 wherein said further processing includes converting said amplified clamped AC component signal to a binary waveform.

* * * * *